United States Patent
Bechtler et al.

(10) Patent No.: US 8,260,516 B2
(45) Date of Patent: Sep. 4, 2012

(54) GOOD CHECKING FOR VEHICLE BRAKE LIGHT SWITCH

(75) Inventors: Henrik Bechtler, Stuttgart (DE); Ravi Bhadange, Farmington, MI (US); Nachiket Patil, Farmington Hills, MI (US); Takeshi Tokonaga, Yokohama (JP); Stefan Mallmann, Lauffen (DE); Michael Schwab, Korntal (DE); Dietmar Stapel, Sendenhorst (DE); Willy Klier, Bloomfield Hills, MI (US); Joerg Eesmann, Rheine (DE)

(73) Assignee: Robert Bosch GmbH, Stuttgart (DE)

( * ) Notice: Subject to any disclaimer, the term of this patent is extended or adjusted under 35 U.S.C. 154(b) by 208 days.

(21) Appl. No.: 12/860,389

(22) Filed: Aug. 20, 2010

(65) Prior Publication Data
US 2011/0071723 A1 Mar. 24, 2011

Related U.S. Application Data

(60) Provisional application No. 61/236,406, filed on Aug. 24, 2009.

(51) Int. Cl.
*G06F 7/70* (2006.01)
(52) U.S. Cl. .......................................... 701/70; 701/76
(58) Field of Classification Search .................. 701/70, 701/76
See application file for complete search history.

(56) References Cited

U.S. PATENT DOCUMENTS

| | | | |
|---|---|---|---|
| 6,491,357 B2 | 12/2002 | Holst | |
| 6,834,221 B2 | 12/2004 | Jäger et al. | |
| 7,191,041 B2 | 3/2007 | von Schwertfuehrer et al. | |
| 7,823,986 B2 * | 11/2010 | Ruffer et al. | 303/115.3 |
| 2001/0044688 A1 | 11/2001 | Okita et al. | |
| 2007/0279207 A1 * | 12/2007 | Clark et al. | 340/479 |
| 2010/0138105 A1 * | 6/2010 | Shibasaki et al. | 701/34 |
| 2010/0269500 A1 * | 10/2010 | Ruffer et al. | 60/545 |
| 2010/0274436 A1 * | 10/2010 | Kodaka et al. | 701/29 |

FOREIGN PATENT DOCUMENTS

| | | |
|---|---|---|
| EP | 1227019 | 7/2002 |
| IT | 1116563 | 2/1986 |

OTHER PUBLICATIONS

EP10173774 European Search Report dated Nov. 30, 2010, 5 pages.

* cited by examiner

*Primary Examiner* — Hussein A. Elchanti
(74) *Attorney, Agent, or Firm* — Michael Best & Friedrich LLP

(57) ABSTRACT

A mechanism for determining whether a malfunctioning sensor has returned to a normal or acceptable operating range. The mechanism includes controllers and methods that perform a "good check" on the sensor to determine whether the sensor has returned to normal or acceptable operation after a malfunction has been detected. When a previously-malfunctioning sensor passes the "good check," warning lights (or tell-tale) indicators are shut off and systems that relied upon information from the malfunctioning sensor return to normal operation.

8 Claims, 7 Drawing Sheets

GOOD CHECKING FOR VEHICLE BRAKE LIGHT SWITCH

RELATED APPLICATION

The present application claims the benefit of prior filed co-pending U.S. Provisional Patent Application No. 61/236,406 filed on Aug. 24, 2009, the entire content of which is hereby incorporated by reference.

This application is related to the following United States patent applications: United States patent applications: U.S. patent application Ser. No. 12/860,362, filed on Aug. 20, 2010 entitled GOOD CHECKING FOR VEHICLE WHEEL SPEED SENSORS; and U.S. patent application Ser. No. 12/860,370, filed on Aug. 20, 2010 and entitled GOOD CHECKING FOR VEHICLE LONGITUDINAL ACCELERATION SENSOR; and U.S. patent application Ser. No. 12/860,376, filed on Aug. 20, 2010 and entitled GOOD CHECKING FOR VEHICLE LATERAL ACCELERATION SENSOR; and U.S. patent application Ser. No. 12/860,396, filed on Aug. 20, 2010 and entitled GOOD CHECKING FOR VEHICLE PRESSURE SENSOR; and U.S. patent application Ser. No. 12/860,407, filed on Aug. 20, 2010 and entitled GOOD CHECKING FOR VEHICLE STEERING ANGLE SENSOR; and U.S. patent application Ser. No. 12/860,418, filed on Aug. 20, 2010 and entitled GOOD CHECKING FOR VEHICLE YAW RATE SENSOR.

BACKGROUND

Modern vehicles include computer systems for controlling engine emissions, vehicle braking, and a variety of other items. The systems require data in order to function, such as oxygen level data for controlling engine emissions and wheel speed data for controlling braking. This data is generally supplied by sensors located throughout the vehicle. To ensure the integrity of the data provided by the sensors, controllers perform malfunction testing on the sensors (or the signals or data the sensors provide). If a sensor malfunction is detected (in other words, there is an error in the sensor output or sensor data), a warning light or similar indicator can be activated.

SUMMARY

While current vehicle systems are designed to monitor the functioning or operation of vehicle sensors and determine when a sensor malfunction occurs, such systems lack, at least in general, robust abilities for determining when the sensor malfunction ends. For example, a sensor malfunction might be caused by a powerful source of electromagnetic interference ("EMI"). Such a circumstance might occur if a vehicle passes near an electrical power generation plant, a radar or broadcast installation, or similar location. Once the vehicle moves outside the range of the EMI, the output from the sensor might return to within an acceptable range. However, in many vehicles, once a sensor malfunction occurs, the only way in which the malfunction or error may be cleared is to have a mechanic or technician access the system, check its operation, and perform an act that resets the system or otherwise removes the error.

A check of the sensor signal based on a re-detection by the failure monitoring function can be used as a mechanism to determine if a sensor has returned to normal operation. However, "good checking" is more than this. In general, malfunction monitoring functions are designed to avoid misdetection. On the other hand, "good check" functions are, in general, designed to avoid a false good check, i.e., a good check function has smaller tolerances for deviations and fewer conditions on the driving situation to perform the evaluation. Or, in other words, the tolerances and conditions used in good checking are different than those used to detect a malfunction.

Embodiments of the invention provide a mechanism for automatically determining whether a malfunctioning sensor has returned to a normal or acceptable operating range. In the parlance of the inventors, embodiments of the invention perform a "good check" on the sensor to determine whether the sensor has returned to normal or acceptable operation after a malfunction has been detected. When a previously-malfunctioning sensor passes the "good check," warning lights (or tell-tale) indicators are shut off and systems that relied upon information from the malfunctioning sensor return to normal operation.

In one embodiment, the invention provides a controller for determining whether a previously-detected, vehicle-sensor malfunction still exists. The controller includes an electronic, non-volatile memory and an electronic processing unit connected to the electronic, non-volatile memory. The electronic processing module includes a malfunction monitoring module, a failure handling module, and a signal checking module.

The malfunction monitoring module monitors the operation of a brake light switch and generates a fault signal when the brake light switch malfunctions. The fault signal contains fault information and causes a tell-tale indicator to be activated or a vehicle control system (such as an engine control system, traction control system, vehicle stability system or the like) to modify its operation from a first operating state to a second operating state. The failure handling module stores the fault information and corresponding drive cycle information in the electronic, non-volatile memory.

The signal checking module retrieves the drive cycle information from the memory and performs a "good check" or signal check on information from the brake light switch. The signal check verifies that the brake light switch exhibits a predetermined pattern. If the brake light switch passes the signal check function, the signal checking module generates a reset signal that causes the tell-tale indicator to be deactivated, causes the vehicle control system to resume operation in the first operating state, or both.

In some embodiments, the predetermined pattern includes a low signal for a predetermined time, then a high signal for a predetermined time, and then a second low signal for a predetermined period of time. The signal checking module uses a counter to track whether the brake light switch exhibits the predetermined pattern. The signal checking module performs the signal check on information from the brake light switch while a vehicle monitored by the brake light is substantially stationary.

Other embodiments of the invention provide a method, executed by a controller including an electronic processing unit and an electronic, non-volatile memory, for determining whether a previously-detected, vehicle-sensor malfunction still exists. The method includes monitoring (with a malfunction monitoring module executed by the electronic processing unit) the operation of a brake light switch and generating a fault signal (containing fault information) when the brake light switch malfunctions. The method also includes activating a tell-tale indictor or modifying the operation of a vehicle control system from a first operating state to a second operating state when the fault signal is generated. In addition, the method includes storing the fault information and corresponding drive cycle information in the electronic, non-volatile memory using a failure handling module executed by the electronic processing unit.

The method also includes retrieving the drive cycle information and performing a signal check on information from the brake light switch. Performing the signal check on the brake light switch includes verifying that the brake light switch exhibits a predetermined pattern. If the brake light switch passes the signal check function, a reset signal is generated by the signal checking module. The reset signal causes the tell-tale indicator to turn off, the vehicle control system to resume operation in the first operating state, or both.

In some embodiments, performing the signal check on information from the brake light switch that verifies that the brake light switch exhibits the predetermined pattern includes performing the signal check on information from the brake light switch that verifies that the brake light switch generates a low signal for a predetermined amount of time, then a high signal for a predetermined amount of time, and then a second low signal for a predetermined amount of time. The method also uses a counter, with the signal checking module, to track whether the brake light switch exhibits the predetermined pattern. Performing the signal check includes performing the signal check while a vehicle monitored by the brake light switch is substantially stationary.

Other aspects of the invention will become apparent by consideration of the detailed description and accompanying drawings.

DETAILED DESCRIPTION

Figure 1:
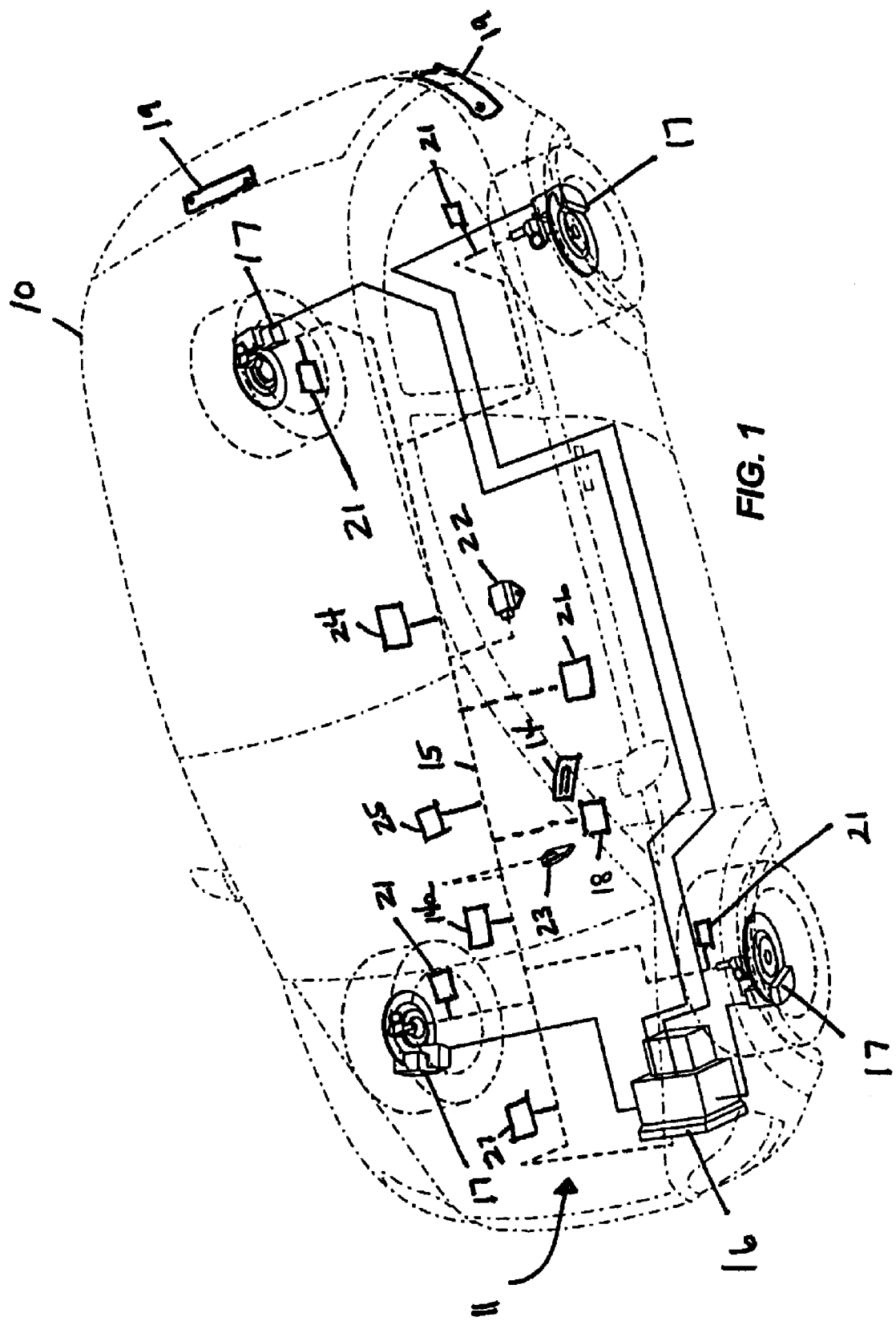
FIG. 1 is a perspective view of a vehicle including a vehicle control system according to one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

It should also be noted that a plurality of hardware and software based devices, as well as a plurality of different structural components, may be utilized to implement the invention. Furthermore, and as described in subsequent paragraphs, the specific configurations illustrated in the drawings are intended to exemplify embodiments of the invention. Alternative configurations are possible.

FIG. 1 illustrates a vehicle 10 including a vehicle control system 11. The vehicle control system 11 includes a brake pedal 14 and a brake light switch ("BLS") 18. The BLS 18 is wired to one or more brake lights 19 (wiring not shown). When an operator presses down the brake pedal 14, the pedal 14 presses down and creates contact with the BLS 18, which completes a circuit between the brake lights 19 and a power source, such as the vehicle's battery (not shown). With the circuit completed, the brake lights 19 are illuminated.

Information output by the BLS 18 is transmitted over a connection or network, such as a controller area network ("CAN") bus 15. The BLS 18 sends information over the bus 15 indicating whether the circuit between the BLS 18 and the brake lights 19 is complete (i.e., whether the brake lights are illuminated). For example, if the circuit is complete and the brake lights are being illuminated, the BLS 18 outputs a power or "high" signal to the bus 15. Alternatively, if the circuit is incomplete and the brake lights 19 are not being illuminated, the BLS 18 outputs a no-power or "low" signal to the bus 15.

Other components connected to the bus 15 may receive the information from the BLS 18 and use that information to control other aspects of the vehicle 10. For example, a controller 16 receives information from the BLS 18 over the bus 15. In some embodiments, the controller 16 provides electronic stability control ("ESC") functionality. For example, when the controller 16 detects a loss of steering control (e.g., understeer or oversteer), the controller 16 automatically applies one or more individual brakes 17 to help steer the vehicle 10 in a desired direction. In some embodiments, the controller 16 also reduces engine power when it detects a skid or slide of the vehicle 10 until the vehicle operator regains control of the vehicle 10.

As shown in FIG. 1, the control system 11 includes the controller 16, the bus 15, and a plurality of sensors. The sensors can include one or more wheel speed sensors 21, a yaw rate sensor 22, a steering sensor 23, a pitch sensor 24, a roll sensor 25, a longitudinal acceleration sensor 26, a lateral acceleration sensor 27, the BLS 18, and a brake pressure sensor 14a.

Figure 2:
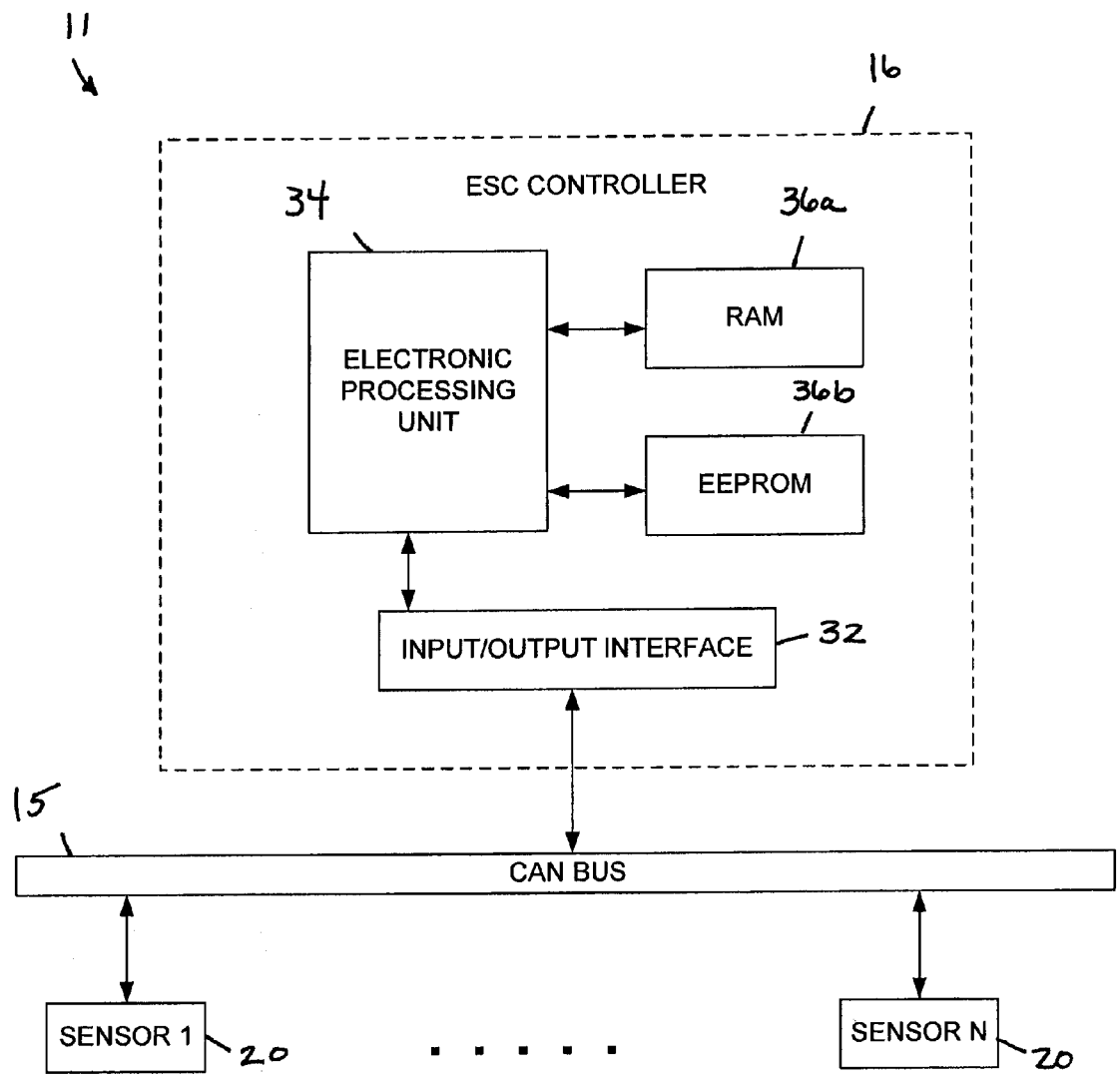
FIG. 2 schematically illustrates the vehicle control system of FIG. 1 according to one embodiment of the invention.

FIG. 2 schematically illustrates the vehicle control system 11 of FIG. 1 in greater detail. The numerous sensors depicted in FIG. 1 are represented generally by boxes 20 (Sensor 1 . . . Sensor N). As also shown in FIG. 2, the controller 16 includes an input/output interface 32, an electronic processing unit ("EPU") 34, and one or more memory modules, such as a random access memory ("RAM") module 46a and an electronically erasable programmable read-only memory ("EEPROM") module 46b. As shown in FIG. 2, the input/output interface 32 transmits and/or receives information over the bus 15. In other embodiments, the input/output interface 32 transmits and/or receives information directly to and/or from the sensors 20 rather than over the bus 15.

The EPU 34 receives the information from the input/output interface 32 and processes the information by executing one or more applications or modules. The applications or modules are stored in memory (such as EEPROM 36b). The EPU 34 also stores information (e.g., information received from the bus 15 or information generated as a result of executing instructions) in memory. For example, as described below, the EPU 34 stores drive cycle information and fault information in the EEPROM 36b.

Figure 3:
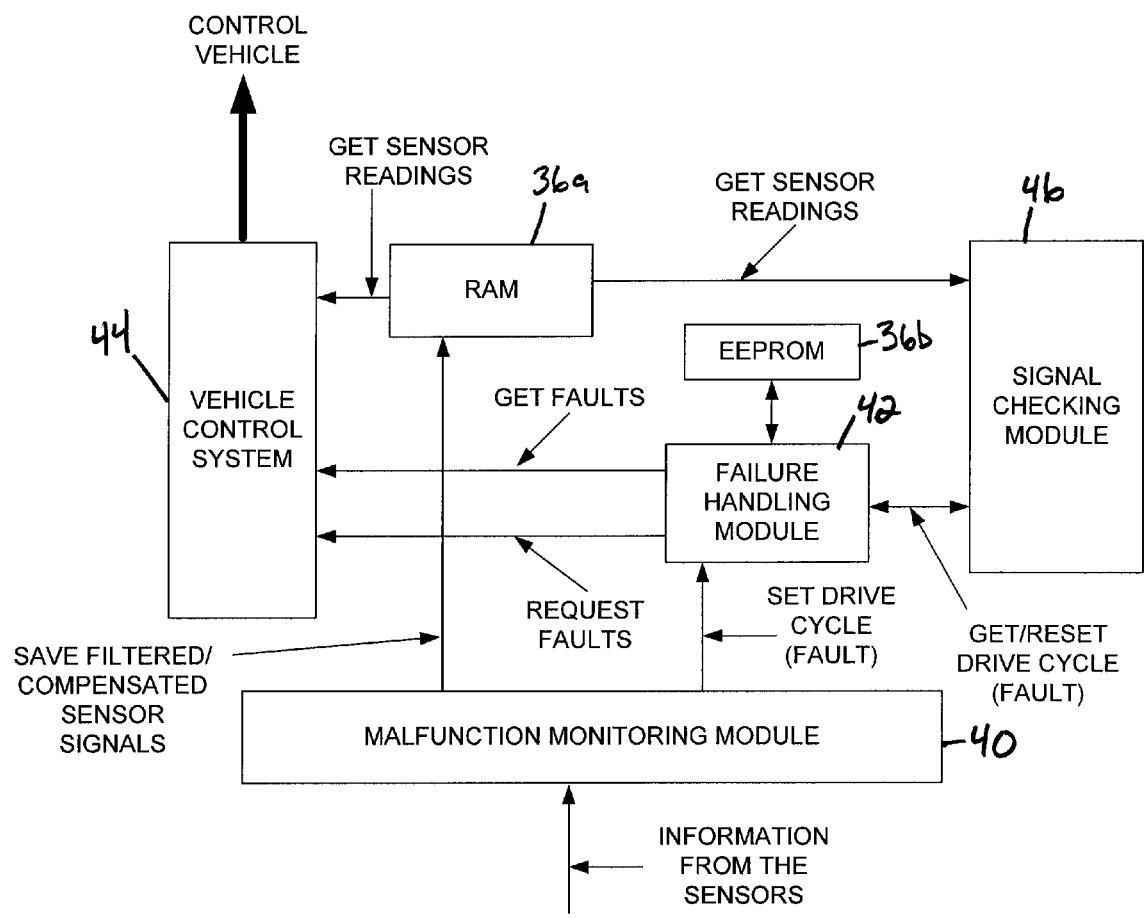
FIG. 3 schematically illustrates the functional operation of modules of the vehicle control system of FIG. 2 according to one embodiment of the invention.

FIG. 3 illustrates the functional operation of applications or modules executed by the EPU 34 of the controller 16. As shown in FIG. 3, the EPU 34 executes a malfunction monitoring module 40, a failure handling module 42, a vehicle control system 44 (such as an electronic stability control ("ESC") program or application), and a signal checking module 46. The malfunction monitoring module 40 receives sensor signals from the sensors 20 over the bus 15 (e.g., through the input/output interface 32) and saves the sensor signals to the memory. As shown in FIG. 3, the malfunction monitoring module 40 saves filtered and/or compensated sensor signals to the memory rather than raw data. For example, over time a sensor 20 may become dirty or damaged, which can affect the sensor's operation. The malfunction monitoring module 22 applies an offset (positive or negative) to the signals received from a particular sensor 20 to compensate for the sensor's deterioration and stores the compensated sensor signal to the memory. As described below, if a particular sensor's offset gets too large (in either the positive or the negative direction), the malfunction monitoring module 40 determines that the sensor 20 is malfunctioning or faulty and generates a fault signal. The malfunction monitoring module 22 also saves additional information to the memory, such as sensor offsets, detected faults, and other statistical information about a particular sensor (e.g., an average sensor reading, a median sensor reading, etc.).

The main function or purpose of the malfunction monitoring module 40 is to determine if a particular sensor is malfunctioning or faulty. For example, as mentioned above, if a sensor's offset becomes too large, the malfunction monitoring module 40 may determine that the sensor 20 is malfunctioning. A variety of other algorithms and techniques for determining whether a sensor is malfunction can also be used including those disclosed in, for example, U.S. Pat. No. 6,834,221. As shown in FIG. 3, when the malfunction monitoring module 40 detects a malfunctioning or faulty sensor, the module 40 generates a fault signal and sends the fault signal to the fault handling module 42. The fault signal includes fault information based on the particular fault or malfunction observed by the malfunction monitoring module 40. The failure handling module 42 stores the fault information and corresponding counter information, (which is referred to as "drive cycle information") in memory. The drive cycle information indicates what signal check functions should be performed by the signal checking module 46 during the next drive cycle (e.g., the next time during which malfunction testing is performed) to determine whether a previously-detected fault still exists. For example, if the malfunction monitoring module 40 detects that the pressure sensor 14*a* is malfunctioning and generates a fault signal, the fault handling module 42 saves drive cycle information to memory indicating that the signal checking module 46 should check the pressure sensor 14*a* during a subsequent cycle to determine whether the previously-detected pressure sensor fault still exists.

As shown in FIG. 3, the vehicle control system 44 requests the currently-detected faults from the failure handling module 42. The failure handling module 42 retrieves the stored fault information from memory and sends the fault information to the vehicle control system 44. In other embodiments, the vehicle control system 44 obtains currently-detected faults from the malfunction monitoring module 40, the RAM 36*a*, the bus 15, or other components included in the system 11.

After obtaining them, the vehicle control system 44 determines how to handle the current faults. In some embodiments, the vehicle control system 44 activates one or more warning lights or tell-tales in the vehicle 10 (e.g., on the vehicle's dashboard or instrument panel) in response to the currently-detected faults. In some applications, the warning lights or tell-tales provide information to the vehicle operator regarding the one or more faulty sensors 20. In other applications, the warning lights or tell-tales provide information about a vehicle system. For example, if a faulty brake pressure sensor is detected the vehicle may activate a warning light regarding the anti-lock braking system rather than activating a specific warning light regarding the brake pressure sensor. Thus, the warning light or tell tale may only provide general information to the driver regarding the existence of a fault, whereas the control system 44 knows the specific nature of the fault.

Although not strictly required, in almost all instances the vehicle control system 44 modifies its operation in response to faults determined by the malfunction monitoring module 40 in addition to activating a warning light or tell tale. For example, if a particular sensor 20 is malfunctioning, the vehicle control system 44 changes its operation from a first operating state (e.g., ON) to a second operating state (e.g., OFF). In the first or "normal" operating state, the vehicle control system 44 operates as intended or programmed using all the data it receives from the sensors 20. In the second operating state, the vehicle control system turns itself off (as noted) or, alternatively, operates in a state where information from faulty sensors is ignored, but control is still provided based on information from the remaining, non-malfunctioning sensors. Yet another option is for the vehicle control system 44 to operate in a manner in which some of its functionality or features are reduced. The factors determining the exact parameters of the second state of operation of the vehicle control system is a measure of the criticality or importance of the information provided by the malfunctioning sensor. For example, information from a yaw rate sensor may be critical to certain vehicle control functions (such as ESC), but may be unimportant or less critical to others (such as traction control). Thus, if a yaw rate sensor malfunction is detected, traction control may continue to function based on information from other sensors, but ESC might be turned off. If the vehicle control system 44 deactivates or modifies its functionality or other types of vehicle control or monitoring functionality, the vehicle control system 44 can activate one or more warning lights or tell-tales that warn the vehicle operator of the modified operating state.

The signal checking module 46 retrieves drive cycle information stored in memory and performs various "good check" or signal checks to determine whether a previously-detected sensor malfunction still exists. In some embodiments, the signal checking module 46 is initialized during each new ignition cycle and retrieves the stored drive cycle information upon each initialization. In other embodiments, the signal checking module 46 retrieves stored drive cycle information from memory at various times while the controller 16 is operating.

Performing a signal check includes testing current readings or information from a particular sensor 20. Therefore, the signal checking module 46 obtains current sensor readings from the memory, the bus 15, the malfunction monitoring module 40, or from other components of the system 11. The current sensor readings include compensated or filtered sensor signals or information, raw sensor information, current sensor offsets, and/or other statistical information about a particular sensor 20. Once the signal checking module 46 obtains current sensor readings, the module 46 compares the information to one or more thresholds to determine whether a previously-detected fault still exists. The signal checking module 46 can also execute a test on a sensor by sending information to a sensor and observing the response.

If the signal checking module 46 determines that a previously-detected fault doesn't exist anymore, the module 46 resets the corresponding fault information and/or drive cycle information in memory. The signal checking module 46 resets the drive cycle information by generating a reset signal. The failure handling module 42 receives the reset signal and updates the fault information and/or drive cycle information stored in memory to indicate that the previously-detected fault no longer exists (e.g., by deleting the previous fault and/or drive cycle information or setting a fault bit or flag to an "okay" or "no fault" value). When the vehicle control system 44 subsequently requests the current faults from the failure handling module 42, the failure handling module 42 informs the vehicle control system 44 that the previously-detected fault no longer exists (e.g., by failing to list the fault as one of the current faults). The vehicle control system 44 re-assesses the current faults and, in some embodiments, deactivates a previously-activated warning light or tell-tale within the vehicle 10 and/or returns its operation back to a first or original operating state (e.g., an ON state).

On the other hand, if the signal checking module 46 determines that the previously-detected fault still exists, the signal checking module 46 sets the corresponding fault and/or drive cycle information in memory. By setting the corresponding fault and/or drive cycle information in memory, the signal checking module 46 ensures that the stored fault information and/or drive cycle information continues to indicate that the fault exists so that (1) the vehicle control system 44 is informed of the existence of the fault and (2) the signal checking module 46 will run another signal check on the fault during subsequent operation. The signal checking module 46 sets the fault and/or drive cycle information by generating a set signal. The failure handling module 42 receives the set signal and ensures that the fault information and/or drive cycle information in memory continues to indicate that the fault still exists. In other embodiments, the signal checking module 46 simply fails to reset the fault and/or drive cycle information (e.g., fails to generate and output a reset signal), which retains the fault and/or drive cycle information in the same state as before the signal checking module 46 performed its signal checks.

Figure 4:
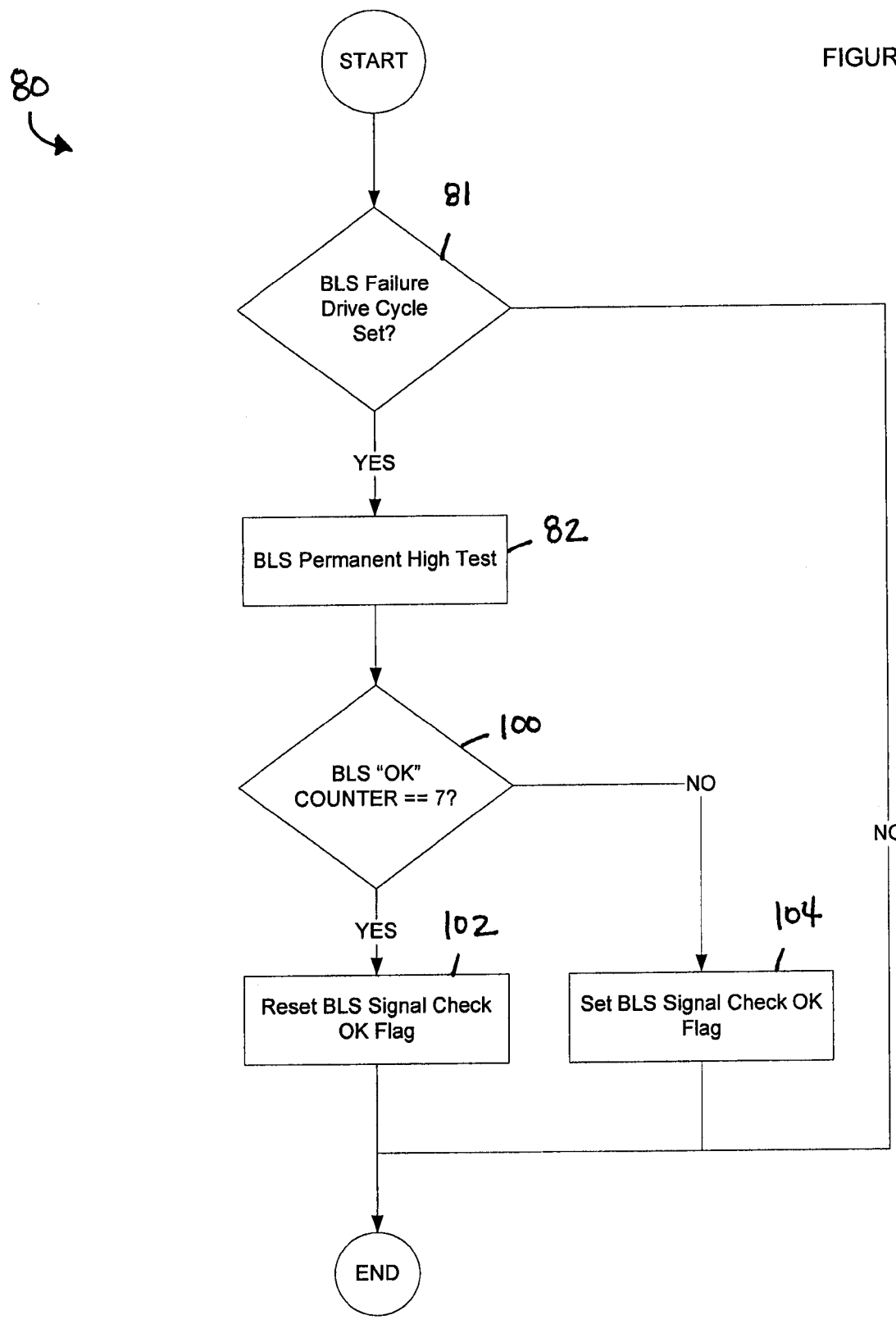
FIG. 4 illustrates a first signal check performed by the signal checking module of FIG. 3 according to one embodiment of the invention.

FIG. 4 illustrates a first BLS signal check 80 performed by the signal checking module 46. The signal checking module 46 executes the first BLS signal check 80 after, for example, the malfunction monitoring module 40 detects a BLS permanent high malfunction. A BLS permanent high malfunction occurs when the malfunction monitoring module 40 determines that the BLS 18 is stuck in a "high" position (i.e., has been outputting a "high" signal for a predetermined time).

As shown in FIG. 4, the first step of the first BLS signal check 80 includes determining whether the retrieved drive cycle information specifies that a BLS permanent high malfunction has occurred (step 81). The retrieved drive information can includes a flag or bit (e.g., a BLS failure drive cycle bit or flag) that is set accordingly. If this flag is not set, the signal checking module 46 ends the first BLS signal check 80. If this flag is set, the signal checking module 46 executes a BLS test 82, such as a BLS permanent high test.

Figure 5A:
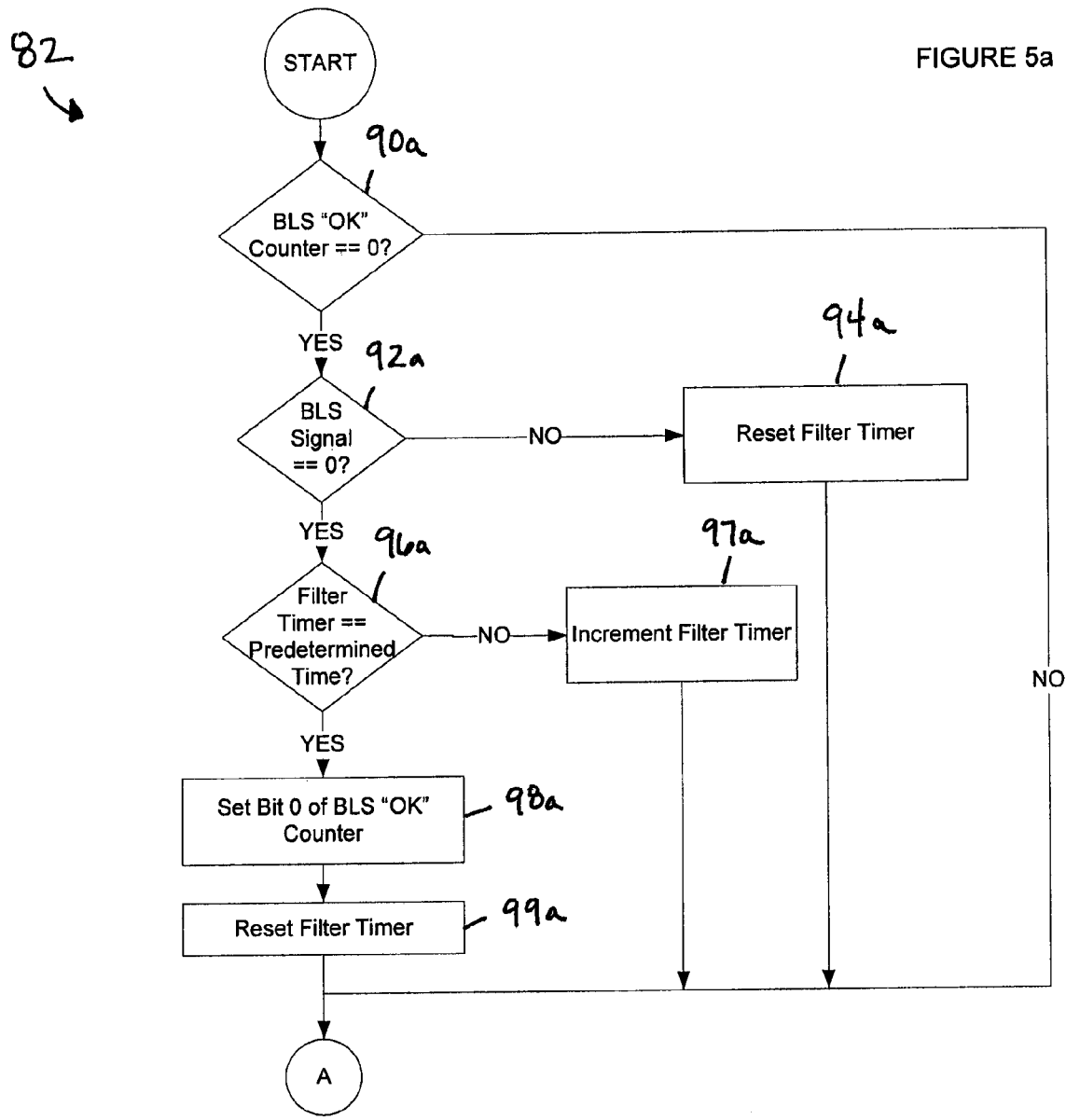
FIGS. 5a-c illustrate the first signal check of FIG. 4 according to one embodiment of the invention.
Figure 5B:
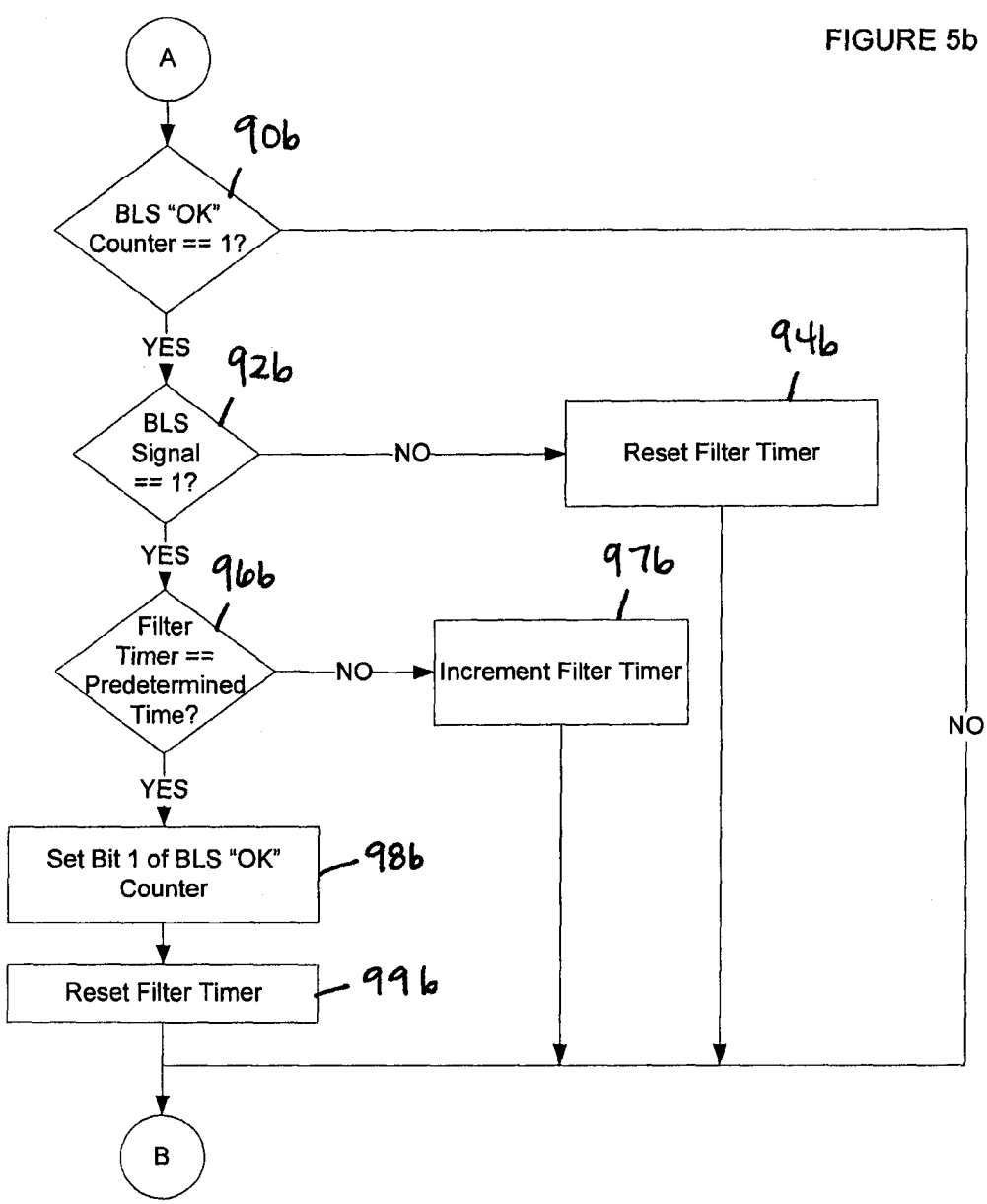
Figure 5C:
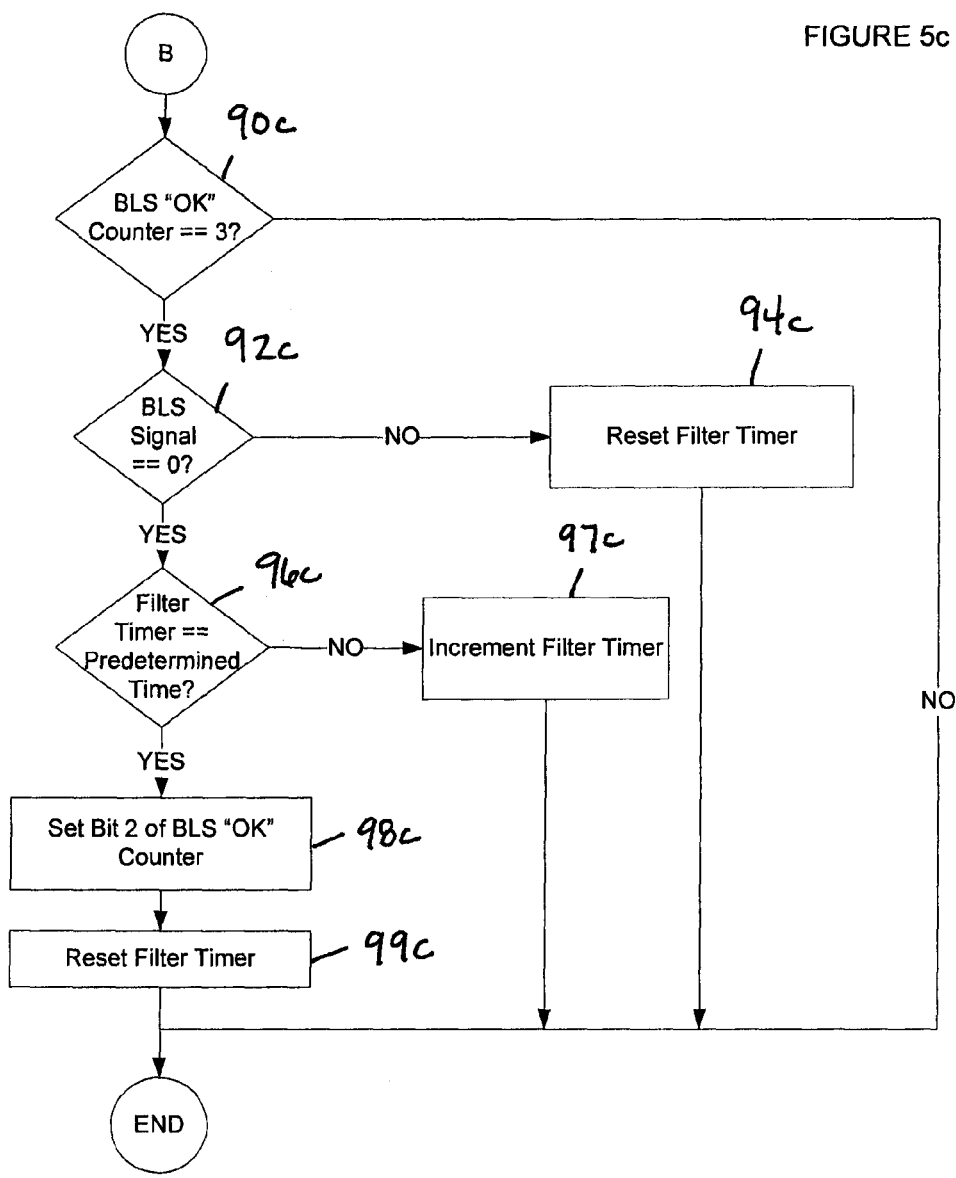

FIGS. 5*a*-*c* illustrate the BLS test 82, which determines whether the BLS 18 exhibits a predetermined pattern. The pattern includes a low signal, followed by a high signal, and followed by second low signal. It is to be understood that the second low signal may be substantially the same as the first signal or may vary therefrom. This particular pattern indicates that the BLS 18 is not stuck in a permanent high state. In some embodiments, the BLS 18 must exhibit each signal of the pattern for a predetermined time (e.g., 0 to 1 second, which varies based on the characteristics of the vehicle). The predetermined time may be the same for each signal of the pattern or may be different.

The signal checking module 46 uses a BLS "OK" Counter to detect the predetermined pattern. The BLS "OK" Counter includes a bit for each state of the predetermined pattern, and the signal checking module 46 sets each bit as it observes each state. Therefore, the BLS "OK" Counter includes 3 bits, wherein the bits represent whether the BLS 18 has demonstrated the first (low signal), second (high signal), and third (low signal) state of the desired pattern. Initially the BLS "OK" Counter bits is set to 000 (i.e., the decimal value of zero) to indicate that the BLS 18 has not yet demonstrated any of the states of the pattern. As the signal checking module 46 observes each state, the module 46 sets the corresponding bit. In particular, after the module 46 observes the first state of the pattern, the signal checking module 46 sets the first bit of the BLS "OK" Counter (i.e., bit 0) to "1," which sets the BLS "OK" Counter to a decimal value of 1. Similarly, after the module 46 observes the second state of the pattern, the module 46 sets the second bit of the BLS "OK" Counter (i.e., bit 1) to "1," which sets the BLS "OK" Counter to a decimal value of 3. Finally, after the module 46 observes the final state of the pattern, the module 46 set the third bit of the BLS "OK" Counter (i.e., bit 2) to "1," which sets the BLS "OK" Counter to a decimal value of 7.

FIG. 5*a* illustrates the portion of the BLS test 82 that determines whether the BLS 18 is demonstrating the first state of the desired pattern (i.e., a low signal). The signal checking module 46 starts by determining if the BLS "OK" Counter is set to the decimal value of 0 (step 90*a*). If the BLS "OK" Counter is not set to 0, the signal checking module 46 has already observed at least one of the states of the desired pattern, and the signal checking module 46 proceeds to check for other states of the pattern (see FIGS. 5*b* and 5*c*).

If the BLS "OK" Counter does equal 0 (step 90*a*), the signal checking module 46 determines whether the BLS 18 is currently demonstrating a low signal (step 92*a*). If the BLS 18 is not currently outputting a low signal, the signal checking module resets a filter timer (step 94*a*) (whose function is described below) and ultimately exits the test 82. The test 82 may be subsequently re-initiated (e.g., in subsequent initiations of the signal checking module 46) to check for the first pattern state.

If, however, the BLS 18 is currently outputting a low signal (step 92*a*), the signal checking module 46 determines whether the BLS 18 has been outputting this signal for the predetermined time (step 96*a*). The signal checking module 46 uses a filter timer to track how long the BLS 18 outputs a particular signal. The filter timer is initially set to 0 when the test 82 is started and is reset after a particular pattern state is observed (see step 99*a*) or when a particular state is not initially observed (see step 94*a*). As shown in FIG. 6*a*, if the BLS 18 has not been outputting a low signal for at least the predetermined time, the signal checking module 46 increments the filter timer (step 97*a*) and ultimately exits the test 82.

However, if the BLS 18 has been outputting a low signal for at least the predetermined time (step 96*a*), the BLS 18 has satisfied the first state of the desired pattern and the signal checking module 46 sets a first bit (i.e., bit 0) of the BLS "OK" Counter to "1" (i.e., setting the BLS "OK" Counter to the decimal value of 1) (step 98*a*). In addition, the signal checking module 46 resets the filter timer (step 99*a*) and proceeds to check for the second state of the desired pattern (see FIG. 5*b*).

FIG. 5*b* illustrates the portion of the BLS test 82 that determines whether the BLS 18 is outputting a high signal for at least the predetermined time and FIG. 5*c* illustrates the portion of the BLS test 82 that determines whether the BLS 18 is outputting a low signal for at least the predetermined time. Because these portions of the BLS test 82 are similar to the portion illustrated in FIG. 5*a*, the details are not described in detail.

Returning to FIG. 4, at step 100, after executing the BLS test 82, the signal checking module 46 determines if the BLS 18 passed the BLS test 82. In particular, the signal checking module 46 determines if the BLS "OK" Counter is set to the decimal value of 7. If so, the signal checking module 46 resets the BLS failure signal check flag to indicate that the previously-detected malfunction of the BLS 18 no longer exists (step 102). To reset the BLS failure signal check flag, the signal checking module generates a reset signal. The failure handling module 42 receives the reset signal and ensures that the fault information and drive cycle information stored in memory no longer indicate that a BLS permanent high malfunction exists. When the vehicle control system 44 subsequently requests the current faults from the failure handling module 42, the vehicle control system 44 will be informed that the BLS permanent high malfunction no longer exists. Based on this information, the vehicle control system 44 deactivates a warning light or tell-tale and/or modifies its operation back to a first operating state (e.g., an ON and fully functional state). After resetting the BLS failure signal check flag, the signal checking module 46 exits the signal check 80.

On the other hand, if the BLS 18 does not pass the BLS test 82, the signal checking module 46 sets the BLS failure signal check flag (step 104) before exiting the signal check 80 by generating a set signal. The failure handling module 42 receives the set signal and ensures that the fault information or drive cycle information stored in memory continues to indicate that the BLS permanent high malfunction exists.

In some embodiments, the signal checking module 46 executes particular signal checks during certain driving maneuvers. For example, the signal checking module 46 may execute the signal checks 80 when the vehicle 10 is substantially stationary or at a standstill. The signal checking module 46 may also execute other tests during a particular signal check. For example, the signal checking module 46 may execute the additional tests along with the BLS test 82, such as when the BLS 18 malfunctions and other sensors 20 also malfunction.

Thus, the invention provides, among other things, a controller for determining whether a previously-detected, vehicle sensor malfunction still exists by executing various signal checks and signal check functions using sensor-related information. Various features and advantages of the invention are set forth in the following claims.

What is claimed is:

1. A controller for determining whether a previously-detected, vehicle-sensor malfunction still exists, the controller comprising:
    an electronic, non-volatile memory; and
    an electronic processing unit connected to the electronic, non-volatile memory, the electronic processing module including,
        a malfunction monitoring module configured to monitor the operation of a brake light switch and generate a fault signal if the brake light switch malfunctions, the fault signal containing fault information and causing at least one of a tell-tale indicator to be activated and a vehicle control system to modify its operation from a first operating state to a second operating state,
        a failure handling module configured to cause drive cycle information and the fault information to be stored in the electronic, non-volatile memory, and
        a signal checking module configured to retrieve the drive cycle information and the fault information from the electronic, non-volatile memory, perform a signal check on information from the brake light switch by verifying that the brake light switch exhibits a predetermined pattern, and, if the brake light switch passes the signal check, generate a reset signal, the reset signal causing at least one of the tell-tale indicator to be deactivated and the vehicle control system to resume operation in the first operating state.

2. The controller of claim 1, wherein the predetermined pattern includes a low signal for a predetermined time, then a high signal for a predetermined time, and then a second low signal for a predetermined period of time.

3. The controller of claim 1, wherein the signal checking module uses a counter to track whether the brake light switch exhibits the predetermined pattern.

4. The controller of claim 1, wherein the signal checking module performs the signal check on information from the brake light switch while a vehicle monitored by the brake light is substantially stationary.

5. A method, executed by a controller including an electronic processing unit and an electronic, non-volatile memory, for determining whether a previously-detected, vehicle-sensor malfunction still exists, the method comprising the steps of:
    monitoring the operation of a brake light switch with a malfunction monitoring module executed by the electronic processing unit;
    generating a fault signal containing fault information with the malfunction monitoring module when the brake light switch malfunctions;
    causing at least one of a tell-tale indicator to be activated or a vehicle control system to modify its operation from a first operating state to a second operating state in response to the fault signal;
    storing drive cycle information and the fault information in the electronic, non-volatile memory with a failure handling module executed by the electronic processing unit;
    retrieving the drive cycle information and the fault information from the electronic, non-volatile memory;
    performing a signal check on information from the brake light switch that verifies that the brake light switch exhibits a predetermined pattern with a signal checking module executed by the electronic processing unit; and
    generating, in response to the verification of the predetermined pattern, a reset signal with the signal checking module that causes at least one of the tell-tale indictor to be deactivated and the vehicle control system to resume operation in the first operating state.

6. The method of claim 5, wherein performing the signal check on information from the brake light switch that verifies that the brake light switch exhibits the predetermined pattern includes performing the signal check on information from the brake light switch that verifies that the brake light switch generates a low signal for a predetermined amount of time, then a high signal for a predetermined amount of time, and then a second low signal for a predetermined amount of time.

7. The method of claim 5, further comprising using a counter, with the signal checking module, to track whether the brake light switch exhibits the predetermined pattern.

8. The method of claim 5, wherein performing the signal check includes performing the signal check while a vehicle monitored by the brake light switch is substantially stationary.

* * * * *